United States Patent [19]
Graf

[11] Patent Number: 5,917,337
[45] Date of Patent: *Jun. 29, 1999

[54] PROGRAMMABLE I/O CELL WITH DATA CONVERSION CAPABILITY

[75] Inventor: W. Alfred Graf, Saratoga, Calif.

[73] Assignee: Cypress Semiconductor Corp., San Jose, Calif.

[ * ] Notice: This patent is subject to a terminal disclaimer.

[21] Appl. No.: 08/578,201

[22] Filed: Dec. 29, 1995

[51] Int. Cl.$^6$ .............................................. H03K 19/177
[52] U.S. Cl. ................... 326/40; 326/41; 326/46; 341/100
[58] Field of Search ................ 341/100; 326/39–41, 326/46–47; 365/219

[56] References Cited

U.S. PATENT DOCUMENTS

| | | | |
|---|---|---|---|
| 4,750,149 | 6/1988 | Miller ....................................... | 364/900 |
| 4,758,746 | 7/1988 | Birkner et al. ............................ | 326/38 |
| 4,942,318 | 7/1990 | Kawana .................................... | 326/37 |
| 4,963,770 | 10/1990 | Keida ........................................ | 326/40 |
| 5,023,484 | 6/1991 | Pathak et al. ............................. | 326/40 |
| 5,027,011 | 6/1991 | Steele ....................................... | 326/40 |
| 5,185,706 | 2/1993 | Agrawal et al. .......................... | 364/489 |
| 5,220,213 | 6/1993 | Chan et al. ............................... | 326/40 |
| 5,231,588 | 7/1993 | Agrawal et al. .......................... | 364/489 |
| 5,282,164 | 1/1994 | Kawana .................................... | 326/39 |
| 5,329,460 | 7/1994 | Agrawal et al. .......................... | 364/489 |

*Primary Examiner*—Jon Santamauro
*Attorney, Agent, or Firm*—Blakely, Sokoloff, Taylor & Zafman

[57] ABSTRACT

A programmable I/O cell with a multiplicity of configurations and data conversion options implemented through the use of antifuses. Increased logic utilization and reduced number of components necessary to implement such designs by using the registers in the I/O cell to implement data conversion functions thereby saving the logic and registers of the FPGA logic cells for implementation of other functions is achieved. Serial-to-parallel and parallel-to-serial data conversion operations utilize adjacent registers in adjacent cells to perform shift operations.

34 Claims, 4 Drawing Sheets

FIG. 4

Configuration Options

| I/O Cell Output Function ↓ / Input Function → | Direct Input | Registered Input | Input Stage of Input Shift Register | Buried Stage of Input Shift Register | Buried Input Register |
|---|---|---|---|---|---|
| Direct Output | Config B'1<br>BIDIR<br>57 | Config B'2<br>BIDIR<br>54, 57, 62 | Config B'3<br>BIDIR<br>54, 61, 57 | Config B'4<br>XI<br>50 or 51, 53<br>60, 61, 57 | Config B'5<br>XI<br>53, 62<br>60, 57 |
| Registered Output | Config B'6<br>BIDIR<br>58, 64, 66 | Config B'7<br>BIDIR<br>54, 62, 58, 64, 66 | Config B'8<br>BIDIR<br>54, 61, 58, 64, 66 | Config B'9<br>XI<br>50 or 51, 53<br>60, 61, 58, 64, 66 | Config B'10<br>XI<br>53, 60, 62,<br>58, 64, 66 |
| Output Stage of Output Shift Register | Config B'11<br>BIDIR<br>67 or 68, 58<br>64, 65 | Config B'12<br>BIDIR<br>67 or 68, 54<br>62, 58, 64, 65 | Config B'13<br>BIDIR<br>67 or 68, 54<br>61, 58, 64, 65 | Config B'14<br>XI<br>67 or 68,<br>67 or 68, 53,<br>60, 61, 58, 64, 65 | Config B'15<br>XI<br>67 or 68,<br>53, 60, 62,<br>58, 64, 65 |
| Buried Stage of Output Shift Register | Config B'16<br>XO<br>67 or 68,<br>59, 64, 66, 65 | Config B'17<br>XO<br>67 or 68,<br>54, 62, 59, 64, 65 | Config B'18<br>XO<br>67 or 68<br>54, 61, 59, 64, 65 | Config B'19<br>DX<br>50 or 51, 67 or 68,<br>56 or 57 & 60,<br>53, 64, 65, 61, 59 | Config B'20<br>DX<br>67 or 68, 59<br>56 or 57 & 60,<br>53, 62, 64, 65 |
| Buried Output Register | Config B'21<br>XO<br>59, 56,<br>64, 66, 69 | Config B'22<br>XO<br>54, 62<br>59, 64, 66, 69 | Config B'23<br>XO<br>54, 61<br>59, 64, 66, 69 | Config B'24<br>DX<br>50 or 51, 53,<br>56 or 57 & 60,<br>61, 64, 66, 69, 59 | Config B'25<br>DX<br>56 or 57 & 60<br>53, 62, 64,<br>66, 69, 59 |

PROGRAMMABLE I/O CELL WITH DATA CONVERSION CAPABILITY

CROSS-REFERENCE TO RELATED APPLICATIONS

This Application is related to the following Applications for United States Letters Patent, each of which are assigned to the Assignee of the present invention:

1. Application Ser. No. 08/581,105 filed Dec. 29, 1995, entitled, "Programmable I/O Cell With Data Conversion Capability".
2. Application Ser. No. 08/580,855 filed Dec. 29, 1995, entitled, "Programmable I/O Cell With Data Conversion Capability".
3. Application Ser. No. 08/580,836 filed Dec. 29, 1995, entitled, "Programmable I/O Cell With Data Conversion Capability".
4. Application Ser. No. 08/580,770 filed Dec. 29, 1995, entitled, "Programmable I/O Cell With Data Conversion Capability".

BACKGROUND

1. Field of the Invention

The area of the present invention relates generally to programmable logic devices and, more particularly, to programmable logic devices having a data conversion capability.

2. Background Art

In data communication and telecommunication applications the need to convert data from parallel data words to a serial data stream or from a serial data stream to parallel data is a frequent requirement. In Complex Programmable Logic Devices (CPLDs) and Filed Programmable Gate Arrays (FPGs) used in these applications this conversion is accomplished by use of logic block or logic cell register resources. When FPGA logic cell registers, or CPLD macrocell registers, are used strictly as shift register stages, the logic associated with the registers so employed is typically wasted.

Occasionally, a small amount of RAM (a few bytes) is needed in a design implemented in an FPGA or CPLD. In other than Look-Up-Table RAM based FPGAs, precious logic cell registers or CPLD macrocell registers may be used to implement this RAM. Typically, the logic resources associated with these registers is, again, wasted, The result of using the registers of FPGA logic cells or CPLD macrocells to create the structures required to perform serial-to-parallel and parallel-to-serial data conversion is inefficient use of the limited register resources. This very low logic efficiency means that a greater number of components is required and greater board area than would otherwise be necessary is used.

SUMMARY OF THE INVENTION

According to one embodiment of the present invention, by providing minimal additional circuitry and programmable elements to the I/O cells of a programmable logic device, many serial-to-parallel and parallel-to-serial data conversion operations typically required in data communication and telecommunication applications can take place in the I/O cells, leaving the bulk of internal resources available to implement other logic functions. The features of the I/O cell allow for a multiplicity of configurations and data conversion options which would otherwise require use of additional registers in the logic cells of prior FPGA architectures.

In one configuration, a preferred embodiment of the present invention allows for the conversion of a serial input data stream to a parallel data word. A first bit of the serial data stream is registered in a first register of a first input/output cell of a programmable logic device. The first bit is transmitted to and registered in a second register in a second input/output cell of the device while a second bit of the serial data stream is registered in the first register. The first bit and the second bit are transmitted out of the second register and the first register, respectively, in parallel into a programmable interconnect matrix such that the first bit and the second bit comprise a parallel data word.

In a second configuration, a preferred embodiment of the present invention allows for converting a serial output data stream to a parallel output data word. A first bit of the serial output data stream is registered in a first register of a first input/output cell of a programmable logic device. The first bit is transmitted to and registered in a second register in a second input/output cell of the device while a second bit of the serial output data stream is registered in the first register. The first bit and the second bit are transmitted from the second register and the first register, respectively, in parallel to two output pins of the device, such that the first bit and the second bit comprise a parallel data word at the two output pins.

Additional configurations of a preferred embodiment allow other data conversion schemes which find applications in data communications, telecommunications and other fields.

BRIEF DESCRIPTION OF THE DRAWINGS

The present invention is illustrated by way of example and not limitation in the figures of the accompanying drawings in which

FIG. 4 shows a table of configurations for one embodiment of the programmable I/O cell of the present invention.

DETAILED DESCRIPTION

Figure 1:
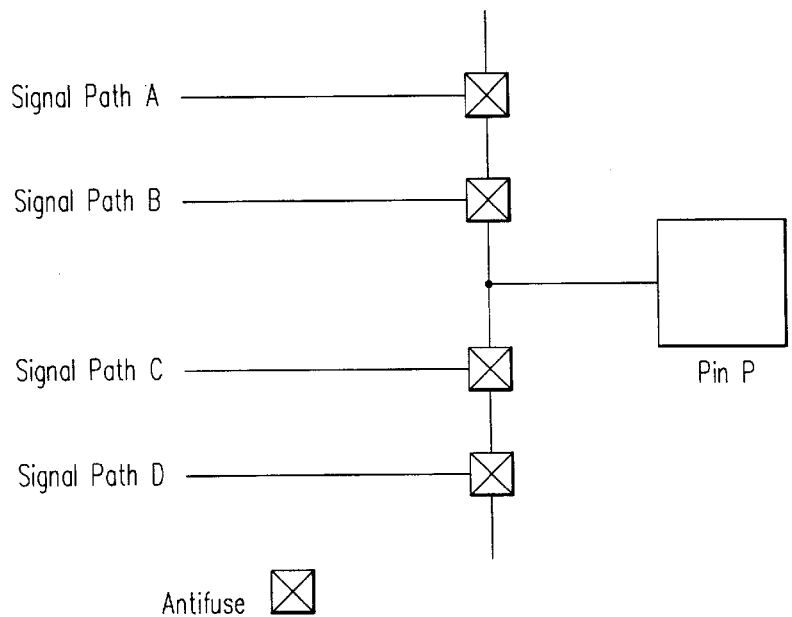
FIG. 1 illustrates antifuse programmed selection of one of four possible data paths.

Referring to the drawings in detail, the following description sets forth numerous specific details in order to provide a thorough understanding of the present invention. However, after reviewing this specification, it will be apparent to those skilled in the art that the present invention may be practiced without these specific details. In other instances, well known structures, techniques and devices have not been described in detail in order to not unnecessarily obscure the present invention.

An I/O cell for an antifuse based FPGA is described. Antifuses are very small, low capacitance programmable elements which are "open" or non-conducting in the virgin (unprogrammed) state but can be programmed by the passage of electric current to form a very low resistance, low capacitance connection. These antifuses can be very useful in the configuration of signal path options in the in the logic blocks and I/O blocks of FPGAs and CPLDs. Although the present description is provided with reference to antifuses, upon review of the specification others skilled in the art will realize that similar implementations could be made using other programmable devices such as EEPROMs and the like. It will be appreciated that the use of such devices is within the scope of the present invention.

Figure 2:
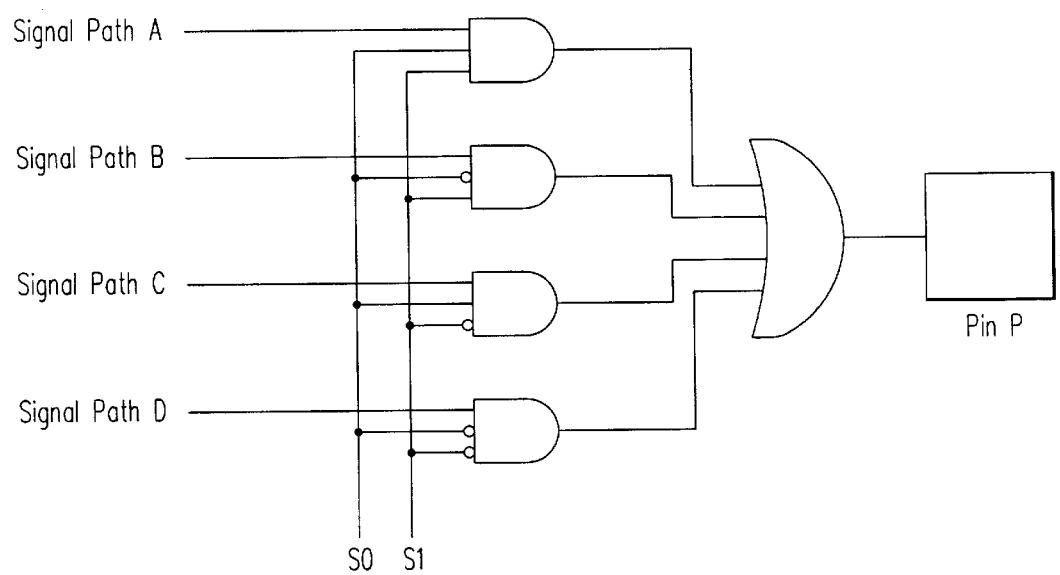
FIG. 2 illustrates multiplexer-based selection of one of four possible data paths.

FIG. 1 shows antifuse-based programmed selection of one of four possible signal paths, one of which may be selected by programming of the appropriate antifuse to be coupled to pin P. The same options selectable by a multiplexer, as is common in RAM-based FPGAs and non-volatile EEPROM and EPROM based CPLDs, is shown in FIG. 2. The multiplexer selection scheme is more complex and is slower than the simpler antifuse selection scheme of FIG. 1. Of course, the design software making the selection of the signal source in the antifuse scheme of FIG. 1 must exclude the possibility that two antifuses would be programmed in any given configuration, as this would result in signal contention.

The further benefit of the antifuse scheme of FIG. 1 is that many signal selection options can be offered with little increase in signal delay because for each new option only the capacitive loading (typically less than 1 pF per antifuse) of the additional unprogrammed antifuse affects the signal delay for the signal path for which the antifuse is programmed.

Because of the small size of the antifuse element relative to the transistors necessary to implement a multiplexer, the selection structure can be implemented in a much smaller silicon area. As the number of signal sources increases, the savings relative to a multiplexer implementation increases.

The ability of antifuses to implement, efficiently and with minimal signal delay, many signal path selection options in a programmable logic block or an I/O block of an FPGA or CPLD means that a greater number of configuration options can be implemented with minimal increase in signal delay and in less silicon area than that required for multiplexer based selection means.

A Flexible Antifuse Based FPGA Input/Output (I/O) Cell

As discussed above, in data communication and telecommunication applications the need to convert data from parallel data words to a serial data stream or from a serial data stream to parallel data is a frequent requirement. This conversion requires many FPGA logic cell registers to be used strictly as shift register stages and usually wastes the logic of the logic cell whose registers are so employed. The following describes an antifuse configured FPGA I/O cell 10 which, in addition to performing conventional I/O, can also implement parallel-to-serial and serial-to-parallel data conversion on-the-fly, as is frequently required in datacom and telecom applications. This approach frees up the registers in the logic cells and avoids wasting of the logic in the logic cells as often results when these conversion functions are implemented in existing FPGAs.

Figure 3:
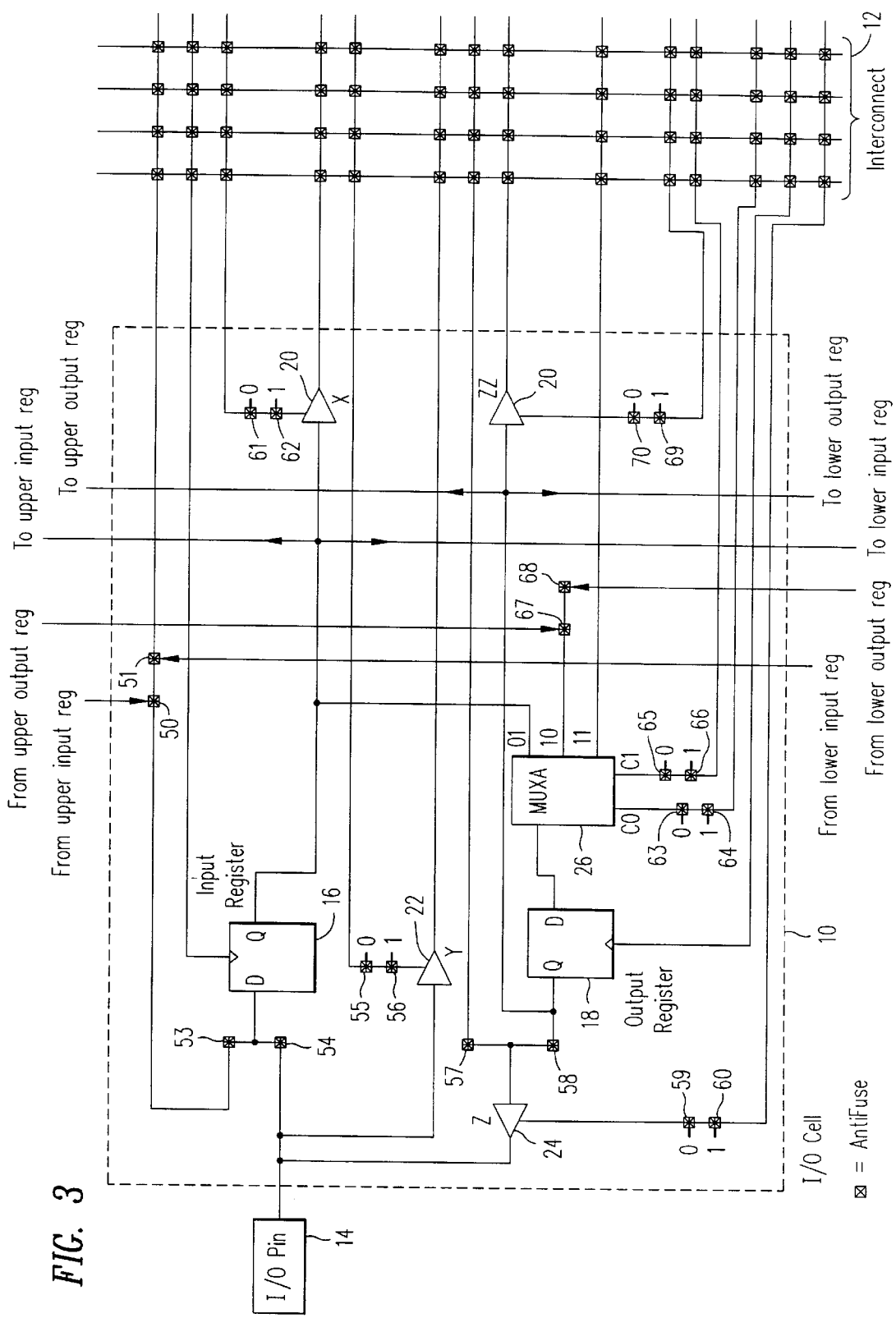
FIG. 3 shows one embodiment of the programmable I/O cell of the present invention.

The FPGA I/O cell 10 is shown in FIG. 3. Several of the novel configurations possible with this I/O cell are described below with the listing of the programmed antifuses necessary to implement the configuration. Those skilled in the art will, upon review of the details of this specification, recognize that other configurations can be achieved and implemented for other applications. The following configurations are therefore presented by way of example and not limitation.

The FPGA I/O cell 10 contains two registers, an input register 16 and an output register 18. FIG. 4 illustrates several of the novel configurations possible with this I/O cell 10 through simultaneous use of the two I/O registers. Each cell in the table of FIG. 4 specifies the programmed antifuses necessary to implement the configuration. In addition, each cell in table of FIG. 4 indicates a configuration type as BIDIR, XO, XI or DX to indicate possible restrictions on the configuration or the class of possible additional configurations which can be variations on the configuration described in the cell. The classes of configurations used are:

BIDIR—This configuration is only possible as a bidirectional configuration in which either the input path or the output path is enabled via logic control of buffers Y 22 and Z 24 respectively. Buffers Y 22 and Z 24 cannot be enabled simultaneously to function as both input path and output path, as contention will result.

XO—This configuration can also simultaneously accommodate a direct output in a bidirectional mode such that buffers Y 22 and Z 24 are used to prevent contention by enabling the input path and the output path respectively at different, mutually exclusive times.

XI—This configuration can also simultaneously accommodate a direct input in a bidirectional mode such that buffers Y 22 and Z 24 are used to prevent contention by enabling the input path and the output path respectively at different, mutually exclusive times.

DX—This configuration can also simultaneously accommodate a direct input or a direct output. In addition, this configuration can also simultaneously accommodate both a direct input and a direct output in a bidirectional mode such that buffers Y 22 and Z 24 are used to prevent contention by enabling the input path and the output path respectively at different, mutually exclusive times.

Three state buffer X 20 in FIG. 3 isolates the output of the input register 16 from internal interconnect 12 when serial data is shifted into a serial shift register composed of multiple of I/O cell 10 input registers 16 for parallel transfer to the internal interconnect 12. Three state buffer Y 22 is provided to isolate the input path interconnect from the I/O pin 14 when pin 14 is being driven as an output in a bidirectional operating mode. The input register 16 can also be configured as a buried register or as an input stage or buried, intermediate stage of a serial input shift register composed of adjacent I/O cell 10 input registers 16. The output register 18 can also be configured as a buried register or as an output stage or buried, intermediate stage of a serial output shift register composed of multiple adjacent I/O cell 10 output registers 18. The input register 16 and the output register 18 of the same I/O cell 10 can be used simultaneously as the input stage, intermediate stage or final stage of two independent internal shift registers, one composed of adjacent I/O cell 10 input registers 16 and the other of I/O cell 10 output registers 18 respectively.

I/O cell 10 also allows the input register 16 and the output register 18 of the same I/O cell 10 to be combined in the same shift register by use of general interconnect 12. In such a shift register, the output of the input register 16 is routed through the interconnect 12 to the input of the output register 18. I/O cell 10 further contains programmable paths to allow direct connection of adjacent input registers 16 as a shift register via antifuse links 50 and 51 and direct connection of adjacent output registers 18 as a shift register via antifuse links 67 and 68.

A shift register may be built of mixed segments of input registers 16 and output registers 18 and allow assembly of physically separated segments of the shift register by use of the general internal interconnect 12.

Internal interconnect 12 is shown in FIG. 3 with only four columns. Those skilled in the art will recognize that this is for convenience only and that interconnect 12 may comprise any number of rows and columns necessary to implement a desired configuration.

Configurations B5, B10, B15, B20 and B21 through B25:

One or both of the I/O cell 10 registers can be used as a buried register when they are not required for I/O when the cells 10 function as a direct input or a direct output. For configurations B5, B10 and B15, the cell 10 can also accommodate an additional direct input in a bidirectional mode of operation since the direct input path is still available even though the input register is used as a buried register. Logic control of buffers Y 22 and Z 24, via connection of the respective buffer control lines to internal interconnect 12, allows bidirectional operation.

For configurations B21, B22 and B23, the cell 10 can also accommodate an additional direct output in a bidirectional mode of operation since the direct output path is still available even though the output register is used as a buried register. Logic control of buffers Y 22 and Z 24, via connection of the respective buffer control lines to internal interconnect 12, allows this bidirectional operation.

Configurations B20, B24 and B25 can implement a dedicated direct input by programming antifuse 56 or a dedicated direct output by programming antifuses 57 and 60 since both direct paths are still available. These same three configurations can implement both direct input and direct output in a bidirectional mode by programming antifuse 57 and leaving antifuses 35, 56, 59 and 60 unprogrammed to allow bidirectional I/O via logic control of buffers Y 22 and Z 24 via connection of the respective buffer control lines to internal interconnect 12.

A summary of the antifuses programmed for these above configurations and the resulting data path operations follows:

For Configuration B5, antifuses 53, 57, 60, and 62 are programmed. Data can be stored in register 16 by transmitting the data from interconnect 12 to the input of register 16. The data is first registered in register 16 and is then transmitted out of register 16 and through buffer X 20 back into interconnect 12. In this fashion, register 16 operates as a buried register. At the same time, data can be transmitted from interconnect 12, through buffer Z 24 directly to the I/O pin 14.

For Configuration B10, antifuses 53,58,60,62,64, and 66 are programmed. Data can be stored in register 16 as for configuration B5. Register output data is transmitted from interconnect 12 through the "11" data path of MUX A 26 to register 18. The data is then registered in register 18 and next transmitted out of register 18, through buffer Z 24, to I/O pin 14.

Configuration B15 has antifuses 53, 58, 60, 62, 64, 65, and 67 or 68 programmed. Buried register operation of register 16 is as for configuration B5. Register 18 operates as the output stage of a serial shift output register comprised of multiple I/O cells 10. Data is received from an adjacent cell 10 via the "10" data path of MUX A 26 and registered in register 18. The data is then transmitted out of register 18 through buffer Z 24 to I/O pin 14.

Figure 5:
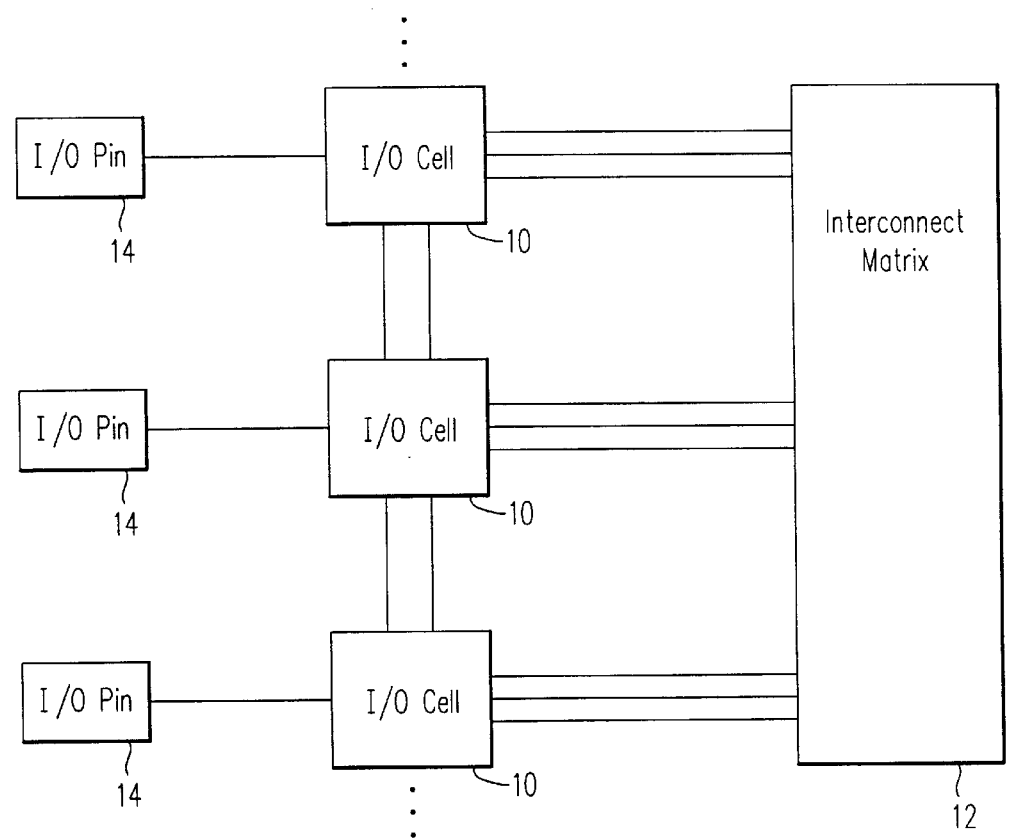
FIG. 5 shows an embodiment of a programmable logic device according to one embodiments of the present invention.

FIG. 5 illustrates an embodiment of a PLD according to the present invention in which adjacent I/O cells 10 are connected. Each I/O 10 is further connected to an I/O pin 14 as well as the programmable interconnected matrix 12.

Configuration B20 has antifuses 53, 56 or 57 and 60, 59, 62, 64, 65, and 67 or 68 programmed. Buried register operation of register 16 is as for configuration B5. Register 18 operates as a buried intermediate register stage in a serial output shift register. Data is received from an adjacent cell 10 via the "10" data path of MUX A 26 and registered in register 18. The data is transmitted out of register 18 and routed to an adjacent cell 10. Additionally, I/O cell 10 can be configured for direct input (antifuse 56 programmed), in which case data is received on I/O pin 14 and transmitted to interconnect 12 via buffer Y 22. Alternatively, cell 10 can be configured for direct output (antifuses 57 and 60 programmed) in which case data from interconnect 12 is transmitted through buffer Z 24 to I/O pin 14. Configuration B20 can also implement bidirectional input/direct output by leaving antifuses 55, 56, 59, and 60 unprogrammed and connecting the respective buffer control lines to interconnect 12 to implement logic control of buffers Y 22 and Z 24.

For Configuration B21, antifuses 56, 59, 64 and 66 are programmed. In this configuration, register 18 operates as a buried register. Data is transmitted from interconnect 12 via the "11" data path of MUX A 26 and registered in register 18. The data is then transmitted out of register 18 and back to interconnect 12. In this configuration, I/O cell 10 also operates as a direct input with data being received on I/O pin 14 and transmitted through buffer Y 22 to interconnect 12.

Configuration B22 requires antifuses 54, 59, 62, 64, and 66 programmed. Buried register 18 operates as for configuration B21. I/O cell 10 also accommodates registered input with data from I/O pin 14 being registered in register 16. This data is then transmitted out through buffer X 20 to interconnect 12.

For Configuration B23, antifuses 54, 59, 61, 64, and 66 are programmed. In this configuration, register 18 operates as a buried register as for configuration B21. I/O cell 10 again accommodates registered input as for Configuration B22, however, the data is now transmitted out of register 16 to an adjacent cell 10. In this fashion, register 16 operates as the first stage of an input serial shift register.

Configuration B24 allows register 16 to be used as a buried intermediate stage of a serial shift register while register 18 is used as a buried register. Antifuses 50 or 51, 53, 56 or 57 and 60, 61, 59, 64, and 66 are programmed. Register 16 receives data from an adjacent cell 10. Data is first registered in register 16 and then transmitted out to another adjacent cell 10. Register 18 operates as for Configuration B21, with data being received from interconnect 12, via data path "11" of MUX A 26 and being registered in register 18. The data is then transmitted out of register 18 to interconnect 12. If antifuse 56 is programmed, the I/O cell 10 also operates for direct input with data received on I/O pin 14 being transmitted through buffer Y 22 to interconnect 12. Alternatively, if antifuses 57 and 60 are programmed, I/O cell 10 operates for direct output with data from interconnect 12 being transmitted via buffer Z 24 to I/O pin 14. Configuration B24 can also implement bidirectional input/direct output by leaving antifuses 55, 56, 59, and 60 unprogrammed and connecting the respective buffer control lines to interconnect 12 to implement logic control of buffers Y 22 and Z 24.

For Configuration B25, antifuses 53, 56 or 57 and 60, 59, 62, 64, and 66 are programmed. Register 16 operates as a buried register as for Configuration B5. Register 18 operates as for configuration B21, receiving data via the "11" data path of MUX A 26. The I/O cell 10 provides for direct input if antifuse 56 is programmed, with data received at I/O pin 14 being transmitted via buffer Y 22 to interconnect 12. Alternatively, if antifuses 57 and 60 are programmed, I/O cell 10 operates for direct output with data from interconnect 12 being transmitted via buffer Z 24 to I/O pin 14. Configuration B25 can also implement bidirectional input/direct output by leaving antifuses 55, 56, 59, and 60 unprogrammed and connecting the respective buffer control lines to interconnect 12 to implement logic control of buffers Y 22 and Z 24.

Configurations B4, B9, B14. and B16 through B19:

One of both of the registers in I/O cell 10 can be used as a buried, intermediate stage of a serial shift register when not required for I/O when the cell 10 functions as a direct input or a direct output. For example, when the I/O cell 10 input path is dedicated to direct or registered input (Configurations B16, B17, and B18), the output register 18 may be used as buried, intermediate stage of a serial, output shift register when linked with other output registers 18 in adjacent I/O cells 10.

When the I/O cell 10 output path is dedicated to direct or registered output (Configurations B4, B9 and B14), the input register 16 may be used as a buried, intermediate stage in an serial shift register when linked with other input registers 16 in adjacent I/O cells 10.

Implementation of a serial shift register with unused input registers 16 in Configurations B4, B9, B14, B19 and B24 requires the stages to be implemented sequentially in adjacent I/O cells 10 to take advantage of the programmable direct link between adjacent input registers 16 via antifuses 50 and 51 in FIG. 3. It will be appreciated that for configurations B4, B9, and B14, the I/O cell 10 can also accommodate an additional direct input in a bidirectional mode of operation since the direct input path is still available even though the input register 16 is used as a buried, intermediate stage of a serial input register. The bidirectional mode of I/O operation is implemented by logical control of buffers Y 22 and Z 24, via connection of the respective buffer control lines to internal interconnect 12, to enable the input path or the output path respectively at mutually exclusive times to avoid contention on the I/O pin 14.

Implementation of a serial shift register with unused output registers 18 in Configurations B16 through B20 requires the stages to be implemented sequentially in adjacent I/O cells 10 to take advantage of the programmable direct serial connection between adjacent output registers 18 afforded by antifuses 67 and 68 in FIG. 3. Notice that for Configurations B16, B17, and B18 the I/O cell 10 can also accommodate an additional direct output in a bidirectional mode of operation since the direct output path is still available even though the output register 18 is used as a buried, intermediate stage of an output serial shift register. The bidirectional mode of I/O operation is implemented by logical control of buffers Y 22 and Z 24, via connection of the respective buffer control lines to internal interconnect 12, to enable the input path or the output path, respectively, at mutually exclusive times to avoid contention on the I/O pin 14.

In addition, Configurations B19, B20, B24 and B25 can accommodate a dedicated direct input or a dedicated direct output since both direct paths are still available. The same configurations (B19, B20, B24 and B25) can, of course, also implement a direct input and a direct output in a bidirectional mode of operation using buffers Y 22 and Z 24 of FIG. 3 under logic control, via connection of the respective buffer control lines to internal interconnect 12, to enable the input path or the output path, respectively, at mutually exclusive times to avoid contention on the I/O pin 14.

Following is a summary of the above configurations with a listing of the antifuse programming required to implement each configuration.

Configuration B4 has antifuses 50 or 51, 53, 57, 60 and 61 programmed. This configuration allows register 16 to be used as a buried, intermediate stage of a serial shift register. Data is received from an adjacent cell 10 and transmitted out to another adjacent cell 10. I/O cell 10 also operates for direct output with data from interconnect 12 being transmitted via buffer Z 24 to I/O pin 14.

Configuration B9 has antifuses 50 or 51, 53, 58, 60, 61, 64 and 66 programmed. Register 16 operates as a buried, intermediate stage of a serial shift register as for Configuration B4. The I/O cell 10 operates for registered output with data from interconnect 12 being transmitted via data path "11" of MUX A 26 to register 18. The data is first registered in register 18 and then transmitted out of register 18 through buffer Z 24 to I/O pin 14.

For Configuration B14, antifuses 50 or 51, 53, 58, 60, 61, 64, 65, and 67 or 68 are programmed. Register 16 operates as a buried, intermediate stage of a serial shift register as for Configuration B4. Register 18 operates as the output stage of a serial output shift register. Data is received from an adjacent cell 10 via the "10" data path of MUX A 26 and registered in register 18. The data is then transmitted out of register 18 and transmitted through buffer Z 24 to I/O pin 14.

Configuration B16 allows register 18 to be used as a buried, intermediate stage of a serial shift register while I/O cell 10 is configured for direct input. Antifuses 56, 59, 64, 65, and 67 or 68 are programmed. Register 18 receives data from an adjacent cell via the "10" path of MUX A 26. The data is first registered in register 18 and then transmitted out to interconnect 12. Direct input of data from I/O pin 14 is through buffer Y 22 to interconnect 12.

Configuration B17 has antifuses 54, 59, 62, 64, 65, and 67 or 68 programmed. Register 18 operates as a buried, intermediate stage of a serial shift register as for Configuration B16. The I/O cell 10 receives data from I/O pin 14, which is registered in register 16. This data is transmitted out through buffer X 20 into interconnect 12.

For Configuration B18, antifuses 54, 59, 61, 64, 65, and 67 or 68 are programmed. Operation in this configuration is as for Configuration B17 except that the registered input data is transmitted out of register 16 to an adjacent cell, rather than to interconnect 12. In this way, register 16 operates as the input stage of a serial input shift register.

Configuration B19 has antifuses 50 or 51, 53, 56 or 57 and 60, 61, 59, 64, 65, and 67 or 68 programmed. This configuration allows register 16 to operate as a buried, intermediate stage of a serial input shift register, with data being received from an adjacent cell 10. The data is transmitted out of register 16 to another adjacent cell 10. In addition, register 18 operates as a buried, intermediate stage of a serial shift register as for Configuration B17. If antifuse 56 is programmed, the I/O cell 10 receives direct input data from I/O pin 14. The data is transmitted through buffer Y 22 to interconnect 12. Alternatively, if antifuses 57 and 60 are programmed, direct output of data from interconnect 12, through buffer Z 24, to I/O pin 14 is achieved.

Configurations B3, B8 and B13:

I/O Cell 10 of FIG. 3 can also implement an external serial input stage for a shift register implemented in input registers 16 in Configurations B3, B8, B13, B18, and B23. This can be accomplished while still using the output register 18 as a buried register (Configuration 23) or as a buried, intermediate stage of a serial shift register implemented in adjacent output registers 18 (Configuration B18). The other configurations (B3, B8, and B13) can accommodate output path functions which need access to the I/O pin 14 only in a bidirectional mode of operation using buffers Y 22 and Z 24 under logic control, via connection of the respective buffer control lines to interconnect 12, to select the input path or the output path, respectively, at mutually exclusive times to prevent contention on the I/O pin 14. In addition, Configurations B18 and B23 can accommodate a direct output in a bidirectional mode of operation since the direct output path is still available even though the output register 18 has been buried or used as a buried, intermediate stage of a shift register composed of adjacent output registers 18. Buffers Y 22 and Z 24 are used to enable the input path and the output path respectively under logic control, via connection of the respective buffer control lines to interconnect 12, at mutually exclusive times to prevent contention on the I/O pin 14. The above configurations are listed below with the antifuse programming required for each configuration.

Configuration B3 has antifuses 54, 57 and 61 programmed. In this configuration, register 16 is used as the input stage of a serial input shift register with data being received via I/O pin 14. The data is first registered in register 16 and then transmitted out of register 16 to an adjacent cell 10. Through logic control of buffer Z 24, data can be transmitted in a bidirectional mode out of interconnect 12, through buffer Z 24, to I/O pin 14 for direct output. Buffers Y 22 and Z 24 are used to enable the input path and the output path respectively under logic control, via connection of the respective buffer control lines to interconnect 12, at mutually exclusive times to prevent contention on the I/O pin 14.

For Configuration B8, antifuses 54, 58, 61, 64, and 66 are programmed. Register 16 operates as for Configuration B3. This time, register 18 operates to provide registered output of data from interconnect 12 via data path "11" of MUX A 26. The data is output at pin 14 through control of buffer Z 24. Buffers Y 22 and Z 24 are used to enable the input path and the output path respectively under logic control, via connection of the respective buffer control lines to interconnect 12, at mutually exclusive times to prevent contention on the I/O pin 14.

Configuration B13 has antifuses 54, 58, 61, 64, 65, and 67 or 68 programmed. Register 16 operates as for Configuration B3. Register 18 operates as the final stage of a serial output shift register with data being received from an adjacent cell 10 via data path "10" of MUX A 26. Data is first registered in register 18 and then transmitted out of register 18 through buffer Z 24 to I/O pin 14. Buffers Y 22 and Z 24 are used to enable the input path and the output path respectively under logic control, via connection of the respective buffer control lines to interconnect 12, at mutually exclusive times to prevent contention on the I/O pin 14.

Configurations B11 and B12:

I/O Cell 10 of FIG. 3 can also implement a serial output stage for a shift register implemented in adjacent output registers 18 in configurations B11 through B15. This can be accomplished while still using the input register 16 as a buried register (Configuration 15) or as a buried, intermediate stage of a serial shift register implemented in adjacent input registers 16 (configuration B14).

The other configurations (B11, B12, and B13) can accommodate the input path functions which can only access to the I/O pin 14 only in a bidirectional mode of operation using buffers Y 22 and Z 24 under logic control, via connection of the respective buffer control lines to internal interconnect 12, to select the input path or the output path, respectively, at mutually exclusive times to prevent contention on the I/O pin 14. In addition, Configurations B14 and B15 can accommodate a direct input in a bidirectional mode of operation since the direct input path is still available even though the input register 16 has been used as a buried register or used as a buried, intermediate stage of a shift register composed of adjacent input registers 16. The above configurations are listed below with the indication of the required antifuse programming to implement each configuration.

Configuration B11 has antifuses 58, 64, 65, and 67 or 68 programmed. Register 18 operates as the final stage of a serial output shift register with data being received from an adjacent cell 10 via data path "10" of MUX A 26. Data is first registered in register 18 and then transmitted out of register 18 through buffer Z 24 to I/O pin 14. Direct input of data received on input pin 14 is through buffer Y 22 to interconnect 12. Buffers Y 22 and Z 24 are used to enable the input path and the output path respectively under logic control, via connection of the respective buffer control lines to interconnect 12, at mutually exclusive times to prevent contention on the I/O pin 14.

For Configuration B12, antifuses 54, 58, 62, 64, 65, and 67 or 68 are programmed. Register 18 operates as for Configuration B11. Register 16 receives data from input pin 14. The data is transmitted out of register 16 through buffer X 20 and back to interconnect 12. Buffers Y 22 and Z 24 are used to enable the input path and the output path respectively under logic control, via connection of the respective buffer control lines to interconnect 12, at mutually exclusive times to prevent contention on the I/O pin 14.

Configurations B1, B2, B6, and B7:

Configurations B1, B2, B6, and B7 implement bidirectional I/O with direct input and direct output (Configuration Bl), registered input with direct output (Configuration B2), direct input with registered output (Configuration B6), and registered input with registered output (Configuration B7). Buffers Y 22 and Z 24 under logic control, via connection of the respective buffer control lines to internal interconnect 12, allow bidirectional operation by enabling either the input path or the output path respectively under logic control at mutually exclusive times to prevent contention at the I/O pin 14.

Of course, any of the above four configurations or any other bidirectional configuration (labeled BIDIR in FIG. 4) can be dedicated to either input or output alone by programming the HIGH antifuse (antifuse 56) for buffer Y 22 or the HIGH antifuse (antifuse 60) for buffer Z 24, respectively.

The above configurations are listed below with the antifuse programming necessary to implement each configuration.

Configuration B1 requires only antifuse 57 to be programmed. Buffers Y 22 and Z 24 under logic control, via connection of the respective buffer control lines to internal interconnect 12, allow bidirectional operation by enabling either the input path or the output path respectively under logic control at mutually exclusive times to prevent contention at the I/O pin 14.

Configuration B2 has antifuses 54, 57, and 62 programmed. For registered input, data is received at I/O pin 14 and registered in register 16. The data is then transmitted out through buffer X 20 to interconnect 12. Direct output is from interconnect 12, through buffer Z 24 to pin 14. Buffers Y 22 and Z 24 under logic control, via connection of the respective buffer control lines to internal interconnect 12, allow bidirectional operation by enabling either the input path or the output path respectively under logic control at mutually exclusive times to prevent contention at the I/O pin 14.

For Configuration B6, antifuses 58, 64, and 66 are programmed. Registered output of data from interconnect 12 through register 18 is via data path "11" of MUX A 26 and buffer Z 24 to output pin 14. Direct input from pin 14 is through buffer Y 22 to interconnect 12. Buffers Y 22 and Z 24 under logic control, via connection of the respective buffer control lines to internal interconnect 12, allow bidirectional operation by enabling either the input path or the output path respectively under logic control at mutually exclusive times to prevent contention at the I/O pin 14.

Configuration B7 has antifuses 54, 58, 62, 64, and 66 programmed. Registered output with register 18 is as for Configuration B6. Registered input using register 16 is as for Configuration B2. Buffers Y 22 and Z 24 under logic control, via connection of the respective buffer control lines to internal interconnect 12, allow bidirectional operation by enabling either the input path or the output path respectively under logic control at mutually exclusive times to prevent contention at the I/O pin 14.

Configuration B26—Metastable Hardened Two Stage Input Synchronizer:

The input register 16 and output register 18 in I/O cell 10 of FIG. 3 can be combined via the programmable direct link provided by MUX A 26 selection path "01" to implement a two stage synchronizer which can provide very high MTBF (Mean Time Before Failure) performance for metastable events which can occur when interfacing synchronous circuits to unpredictable, asynchronous inputs with some probability of violation of input setup time or input hold time relative to the synchronous input register dock.

For this configuration, antifuses 54, 61, 63, and 66 are programmed. Data is received at I/O pin 14 and registered in register 16. The data is then transmitted out of register 16 and registered in register 18 via the "01" path of MUX A 26. Both registers 16 and 18 are clocked by the same synchronous clock signal. Data in register 18 can be transmitted to interconnect 12. Subsequent clock pulses transfer subsequent input data through the synchronizer to interconnect 12.

Dynamic Data Conversion Configurations:

Configuration BD27—Serial Data Out to Parallel Data Output:

This scheme uses one of configuration B16, B17, B18, B19 or B20 to implement a buried, intermediate stage of a serial shift register in each I/O cell 10 using output registers 18. The shift register is loaded serially from the interconnect 12 by selection of MUX A 26 input path option "11" (antifuses 64 and 66 programmed) for the first register stage and MUX A 26 input path option "10" (antifuse 64 and 65 programmed) for all other stages. For all stages except the first stage, antifuses 67 or 68 must be programmed to create the direct serial link between stages. Antifuse 58 is programmed for all shift register stages and the outputs of each I/O cell 10 are tri-stated by logic control of buffer Z 24 while the shift register is loaded serially from the interconnect 12. Once the shift register is loaded with the desired output data, the device output is enabled via the enabling of buffer Z 24 in each I/O cell 10 to provide data to the output pins 14 in a parallel data word.

The shift register can be composed of shift register segments implemented in contiguous, adjacent I/O cells 10 but whose segments are located in physically separated portion of the chip containing the I/O cells. The output of all segments but the final one can be can be linked through general interconnect 12 to the input of the subsequent segment to create a longer shift string even though the segments are not located in contiguous I/O cells 10. The output of the last stage of all segments except the last segment would be routed through the general interconnect 12 to the MUX A 26 "11" input path of the first stage of the next segment. The output of the final stage of the last segment would not be connected to internal interconnect 12.

To summarize, the initial stage has antifuses 58, 64, and 66 programmed with buffer Z 24 under logic control. All other stages have antifuses 58, 64, 65, and 67 or 68 programmed, again with buffer Z 24 under logic control.

In operation, a serial load from interconnect 12 is accomplished by shifting "W" cycles for "W" stages of serial register to shift "W" bits of binary data serially into the shift register. During the shift-in operation, buffer Z 24 is disabled in all stages of the shift register. Once the serial shift register is loaded, the parallel output transfer is accomplished by enabling buffer Z 24 in each I/O cell 10 of the shift register to transfer data to output pins 14 in parallel.

Configuration BD28—Parallel Data Out to Serial Shift Data Output:

This configuration uses one of configuration B11, B12, B13, B14 or B15 to implement the output stage of a serial shift register in one I/O cell 10 and one of configuration B16, B17, B18, B19 or B20 to implement each of the other shift register stages. Each stage of the shift register is loaded in parallel from the interconnect 12 by selection of MUX A 26 input path option "11" (antifuses 64 and 67 or 68 programmed and C1 switched to HIGH or "1" under logic control) prior to the first rising edge of the output register clock which clocks all stages in unison for one dock cycle.

The MUX A 26 input path option is switched to path "10" for all stages except the first stage for subsequent clock cycles (C1 switched to LOW or "0" under logic control via connection of the MUX A 26 select line to interconnect 12) and on each subsequent rising clock edge data is shifted in the serial shift register and is shifted out of the I/O pin 14 of the last stage. The MUX A 26 input path option for the first register stage is programmed for input path option "11" always selected by programming antifuses 64 and 66 so that on the first shifting clock edge an internal serial bit stream can be appended, if desired, to the stream which was loaded in parallel. This allows multiple bit streams to be easily concatenated. Alternatively, the shift register can be loaded with trailing 1s or 0s, if desired. This scheme also allows a barrel or circular shift to be implemented by feeding the output of the last stage register back to the input of the shift register through the internal interconnect 12.

For circular shift operation, the output of the last stage is routed back through the internal interconnect 12 to the "11" path of MUX A 26 of the fist stage to implement the circular shift. Buffer Z 24 is disabled during the circular shift. Subsequent to the completion of the circular shift, buffer Z 24 is enabled to allow the serial data stream to be shifted out of the I/O pin 14 of the last shift register stage.

Configuration BD29—Serial Data Shift Input to Parallel Data Input:

The addition of Buffer X 20 in I/O cell 10 of FIG. 3 allows isolation of the input path from each input register 16 during a serial input register load. This allows serial-to-parallel input data conversion by avoiding the toggling of internal interconnect 12 while the serial input register implemented in adjacent input registers is being loaded. Tri-state buffer X 20 can be enabled once the serial shift register has been loaded to allow the content of the shift register to be transferred to the internal interconnect 12 as a parallel data word.

One of Configurations B3, B8, B13, B18 or B23 is utilized for the input shift register input stage. One of Configurations B4, B9, B14, B19, or B24 is used for each of the subsequent shift register stages. Once the shift register is loaded, buffer X 20 in each I/O cell 10 containing an input shift register stage is enabled, allowing the serially loaded data to be transferred in parallel into the internal interconnect 12.

The shift register can be composed of shift register segments implemented in register 16 of contiguous, adjacent I/O cells 10 but whose segments are located in physically separated portion of the chip containing the I/O cells. The output of all segments but the final one can be linked through general interconnect 12 to the input of the subsequent segment to create a longer shift string even though the segments are not located in contiguous I/O cells 10. The output of the last stage of all segments except the last segment would be routed through the general internal interconnect 12 to the buried input path of the input register 16 of the first stage of the subsequent shift register segment and antifuses 50 and 51 would remain unprogrammed. Because buffer X 20 would be enabled for the last stage of each shift register segment to route data through interconnect 12 to the first stage of the next segment, the final parallel output destination of these segment final stages would be driven by buffer X 20. This would require each of these internal destinations to be isolated at the destination during serial input shift.

To summarize, the input stage has antifuse 54 programmed, with buffer X 20 under logic control, via connection of the buffer control line to internal interconnect 12. All other stages have antifuses 50 or 51, and 53 programmed, with buffer X 20 under logic control via connection of the buffer control line to internal interconnect 12.

In operation, the serial input load is accomplished as follows: A shift of "W" cycles for "W" stages of serial register is used to shift "W" bits of binary data serially into shift register via first stage I/O pin 14. Buffer X 20 is disabled in all shift register stages during this load. After the serial shift register has been loaded, the parallel input transfer is accomplished by enabling buffer X 20 in each I/O cell 10 of the shift register to transfer the data in parallel into internal interconnect 12.

Configuration BD30—Parallel Data Input to Serial Data Shift Input:

Configuration B26 is implemented in each stage of the serial register. In each cell 10, the input register 16 is loaded in parallel from the I/O pin 14 via a single clock pulse applied to each input cell 10 of the parallel data word. MUX A 26 is set by logic control to the "01" input path. On the next rising clock edge, the content of the input register 16 is transferred to and registered in the output register 18 in the same cell 10. Then MUX A 26 is switched under logic control to select input data path "10" in each I/O cell 10 and the data in the serial shift register composed of output registers 18 in adjacent I/O cells 10 is shifted one stage on each subsequent rising edge of the register clock. Antifuse 67 or 68 is programmed in each cell 10 to allow data to be transferred to the next I/O cell 10 output register 18. The output from the last shift register stage is transferred to the internal interconnect 12.

The first shift register stage implemented in the output register 18 of the I/O cell 10 used for the first register stage is switched to select MUX A 26 input path option "11" after parallel loading via path "10" from the input register 16 in the same I/O cell 10. This allows a second serial bit stream to be appended, if desired, from the internal interconnect 12. Alternatively, the shift register can be filled with trailing 1s or 0s via this path. All other cells 10 in the shift register select MUX A 26 input path "10" to allow data to be transferred to the next shift register stage implemented in the output register 18 of the next I/O cell 10 via antifuse connection 67 or 68.

By switching the initial stage output register 18 to MUX A 26 input path option "11" after the output register 18 has been loaded from the associated input register, a circular shift of the shift register can be performed by connecting, through the internal interconnect 12, the output of the last stage back to the input of the first stage. After the circular shift, the rotated data stream can be shifted from the last register stage to its destination through the internal interconnect 12. The destination of the data from the last register stage will be driving the final internal destination through the internal interconnect 12. This requires the destination to be isolated from the output of the last stage during circular shift.

To summarize, the initial stage has antifuses 54 and 61 programmed, with C0 and C1 under logic control via connection of the C0 and C1 select lines to internal interconnect 12. All other stages have antifuses 54, 61, and 67 or 68 programmed with C0 and C1 under logic control. The parallel load is accomplished as follows: MUX A 26 is set to input path option "01" under logic control for all I/O cells 10 comprising the serial shift register. Two clock pulses on all associated input registers 16 and output registers 18 loads input data into the input register 16 of each cell 10 and transfers that data to the output register 18 in each cell 10.

The serial shift in requires the MUX A 26 input path being switched to input path option "10" for all register stages except for the first register stage which is switched to MUX A 26 input path option "11". "W" clock pulses shift "W" bits from "W" stages into the internal interconnect 12. Trailing 1s or 0s can be loaded into the first stage from interconnect 12.

Alternatively, a circular data shift is accomplished by connecting the output of the last stage, via the internal interconnect 12, to the MUX A 26 input path option "11" of the first stage of the shift register. Each subsequent clock pulse shifts data one stage in a circular fashion. The destination of the data from the last register stage will be driving the final internal destination through the internal interconnect 12. This requires the destination to be isolated from the output of the last stage during circular shift.

Configuration BD31—Internal Serial to Parallel Data Conversion:

Configuration BD29 can be modified to allow internal serial-to-parallel data conversion using the serial connection of adjacent I/O cell 10 input registers 16. This is accomplished by configuring the input path of the first stage input register 16 as a buried register via Configuration B5, B10, B15, B20 or B25.

The shift register can be composed of shift register segments implemented in contiguous, adjacent I/O cells 10 but whose segments are located in physically separated portions of the chip containing the I/O cells. The output of all segments but the final one can be linked through general internal interconnect 12 to the input of the subsequent segment to create a longer shift string even though the segments are not located in contiguous I/O cells 10. The output of the last stage of all segments except the last segment would be routed through the general interconnect 12 to the buried input path of the input register 16 of the I/O cell 10 comprising the first stage of the subsequent shift register segment and antifuses 50 and 51 would remain unprogrammed for that input stage. Because buffer X 20 would be enabled for the last stage of each shift register segment to route data through interconnect 12 to the first stage of the next segment, the final parallel output destination of these segment final stages would be driven by buffer X 20. This would require each of these internal destinations to be isolated at the destination during serial input shift.

For the initial stage configuration, antifuse 53 is programmed and buffer X 20 is logic controlled via connection of the buffer control line to the internal interconnect 12. For all other stages, antifuses 50 or 51, and 53 are programmed and buffer X 20 is logic controlled via connection of the buffer control line to interconnect 12.

In operation, the serial load is accomplished as follows: Buffer X 20 is disabled under logic control. "W" clock pulses then shift "W" bits of serial data from the internal interconnect 12 into "W" serial shift register stages implemented in I/O cell 10 input registers 16. After the serial load is complete, the parallel transfer is achieved by enabling buffer X 20 in each I/O cell 10 of the shift register, to transfer parallel data to the internal interconnect 12.

Configuration B32—Word Wide Input FIFO with Random Read and Word Shuffle:

A first word wide input FIFO can be implemented in I/O cell 10 by extending configuration B26 beyond two stages by appending additional I/O cell 10 output registers 18 and creating a shift register for each bit of the data word. All but the first FIFO location are constructed in I/O cell 10 output registers 18. Buffer Z 24 in disabled in each shift register stage to prevent contention on I/O pin 14. Buffer X 20 is disabled in the first shift register stage for each bit of the data word to prevent input data from toggling the internal interconnect 12.

The "initial" and "second" stages have antifuses 54, 55, 59, 61, 63 and 66 programmed in the first sequential I/O cell 10. The other stages have antifuses 59, 64, 65, and 67 or 68 programmed.

The operation of this first FIFO is as follows: A FIFO load is accomplished by shifting "W" cycles for "W" stages of serial register for each bit of the data word, to shift "W" words of binary data from the I/O pin 14 of the first stage into FIFO locations. Buffer Z 24 is disabled to prevent contention on the I/O pin 14 during FIFO input.

The first FIFO can accomplish shuffling of words in the FIFO by maintaining logic control of buffer X 20 in the first FIFO stage via connection of the buffer control line to interconnect 12 and maintaining the MUX A 26 input path select line C1 under logic control for the second through final stages of the FIFO via connection of the select line C1 to interconnect 12. By enabling buffer X 20 in the first word, once loaded, and by switching the input path to MUX A 26 for any word to the "11" path, the content of the first stage can be loaded into any of the subsequent stages through the internal interconnect 12 to allow assembly of incoming data words in any order. After the transfer of data from the first location to the destination location via its MUX A 26 "11" input path, the MUX A 26 select line C1 can be switched to LOW or "0" to allow FIFO shift to occur via MUX A 26 input path "10".

A second word wide input FIFO can also be constructed using only input registers 16. Buffer X 20 is disabled in each cell 10 to prevent toggling of interconnect 12 during FIFO shifting. The buffer X 20 in the last stage is enabled to allow the last FIFO location to be read into the internal interconnect 12.

For each bit of the FIFO data word, the initial stage configuration has antifuses 54, 55, 59, and 61 programmed in first sequential I/O cell 10. The intermediate stages have antifuses 50 or 51, 53, and 61 programmed. The final stage has antifuses 50 or 51, 53 and 62 programmed.

The second FIFO loads by shifting "W" cycles for "W" stages of serial register for each bit of the data word, to shift "W" words of binary data into FIFO locations. Buffer X 20 is disabled in all but the last FIFO stage to prevent toggling of the internal interconnect 12 during FIFO shift in.

This second FIFO constructed of input registers 16 can be configured such that after serial load of the FIFO is complete, any word of the FIFO can be transferred in parallel to the internal interconnect 12. This is accomplished by leaving buffer X 20 under logic control, via connection of the buffer control line to internal interconnect 12, and selectively enabling buffer X 20 for the shift register stages representing the data word to be transferred to the internal interconnect 12. By this means, random access for read of FIFO locations can be accomplished.

Configuration B33—Word Wide Output FIFO with Random Write and Circular Word Shift:

A word wide output FIFO can be implemented in I/O cell 10 of FIG. 3 by creating a serial output shift register using I/O cell 10 output registers 18 for each bit of the FIFO data word. For each bit of the FIFO data word, the initial stage configuration has antifuses 55, 59, 64, and 66 programmed. The intermediate stages have antifuses 55, 59, 64, 65, and 67 or 68 programmed. The final stage has antifuses 58, 60, 64, 65, and 67 or 68 programmed.

In operation, a FIFO load is accomplished by shifting "W" cycles for "W" stages of serial register, to shift "W" words of binary data into FIFO locations. Buffer Z 24 is disabled for all but the last FIFO location to allow the input path of each I/O cell 10 to be used for input functions.

Once the FIFO is loaded, any location of the FIFO can be written at random from the internal interconnect 12. This is accomplished by leaving MUX A 26 input select line C1 under logic control and selecting MUX A 26 input path option "11" for the registers which represent the word to be written and clocking only those registers to write a new data word from the internal interconnect 12. By returning MUX A 26 input path select line C1 to LOW or "0", the MUX A 26 input path option may be returned to path "10" to allow FIFO shifting to occur.

The output of the last FIFO location can be routed through the internal interconnect 12 to the "11" MUX A 26 input path of the first FIFO stage to accomplish a circular shift of the words in the FIFO. By leaving the control of buffer Z 24 in the final FIFO stage under logic control, via connection of the buffer control line to internal interconnect 12, once the FIFO has been circularly shifted the FIFO contents can be shifted out of the output pins 14 on subsequent dock edges by enabling buffer Z 24.

Configuration B34—I/O Registers Used as a Buried Register File:

Any of the configurations B5, B10, B15, B20 or B25 can be used to store and retrieve parallel data words of any length by parallel docking of data into a bank of I/O cell 10 input registers 16 by clocking each bank of input registers 16 independently while passing input data from an internal interconnect 12 data bus to the input path of the input registers 16 of the corresponding I/O cells 10. The content of any location may be read out to the internal interconnect 12 data bus by selectively enabling the buffer X 20 under logic control, via connection of the buffer control line to internal interconnect 12, for the word to be read onto the internal interconnect 12 data bus. The availability of the buffer X 20 in each I/O cell 10 allows the same data bus in the internal interconnect 12 to be used for reading the content of the register file locations.

For each I/O cell 10, antifuse 53 is programmed and buffer X 20 is left under logic control, via connection of the buffer control line to internal interconnect 12. Each bank of I/O cell 10 input registers 16 is transmitted from a different clock signal source.

Configuration B35—Demultiplexing of Internal Serial Data By Use of Configuration BD31:

The internal serial-to-parallel conversion of Configuration BD31 above can be used to load the input serial shift register implemented in input registers 16 of adjacent I/O cells 10. By selectively enabling the buffer X 20 under logic control (via connection of the buffer control line to internal interconnect 12) in subsets of the I/O cells 10 from which the serial shift register is constructed, demultiplexing of the serial stream can be accomplished as parallel data is transferred onto the internal interconnect 12 output data bus. Care must be taken to prevent bus contention by insuring that only one shift register stage is enabled for each shared internal interconnect 12 output bus line which is shared by the same bit location of each of the subsets demultiplexed from the serial data stream.

The initial stage has antifuse 53 programmed and buffer X 20 under logic control. The other stages have antifuses 50 or 51, and 53 programmed with buffer X 20 under logic control, via connection of the buffer control line to internal interconnect 12. In operation, a serial load requires shifting "W" cycles for "W" serial stages, so that "W" bits of binary data are shifted into "W" shift register stages from the internal interconnect 12 serial input line. Buffer X 20 is disabled in each I/O cell 10 to prevent toggling of internal interconnect 12 output bus during the serial load. For the parallel transfer after the serial load is complete, selected subsets of the serial stream are transferred by selectively enabling the buffer X 20 in the I/O cells 10 corresponding to the subset of serial shift register locations to be transferred to the internal interconnect 12 output bus.

Thus, a novel programmable I/O cell with data conversion capability has been described. The features of the I/O cell allow the configurations and the data conversion options described in I/O registers which would require use of additional registers in the logic cells of prior FPGA architectures. Although the teachings have been presented in connection with a particular circuit embodiment, it should be understood that the methods of the present invention are equally applicable to a number of systems. Therefore, the disclosure should be construed as being exemplary and not limiting and the scope of the invention should be measured only in terms of the appended claims.

What is claimed is:

1. A programmable input/output cell for a programmable logic device having a programmable interconnect matrix, the programmable input/output cell comprising:

an input/output pad;

a register having an input adaptable to be coupled to the programmable interconnect matrix and a register output of either of two adjacent input/output cells via a dedicated signal path separate from the programmable interconnect matrix and further having an output;

a first buffer having an input adaptable to be coupled to the output of the register, the first buffer adaptable to be under the control of a first signal from the programmable interconnect matrix; and a second buffer having an input coupled to the input/output pad, the second buffer adaptable to be under the control of a second signal from the programmable interconnect matrix.

2. A programmable input/output cell as in claim 1 wherein the first buffer further having an output, the output adaptable to be coupled to the input/output pad.

3. A programmable input/output cell as in claim 2 wherein the second buffer further having an output, the output adaptable to be coupled to the programmable interconnect matrix.

4. A programmable input/output cell as in claim 3 wherein the input of the second buffer is further adaptable to be coupled to the output of the register.

5. A programmable input/output cell as in claim 4 wherein the output of the register is further adaptable to be coupled to the programmable interconnect matrix.

6. A programmable input/output cell as in claim 5 further comprising a third buffer adaptable to be under the control of a third signal from the programmable interconnect matrix.

7. A programmable logic device as in claim 6 wherein the output of the register is further adaptable to be coupled to register inputs of the two adjacent input/output cells.

8. A programmable logic device as in claim 7 wherein the output of the third buffer is further adaptable to be coupled to the programmable interconnect matrix.

9. A method of registering data in a programmable logic device comprising the steps of:

receiving a first bit of a serial data stream at a first input/output pad of a first input/output cell;

registering the first bit in a first register of the first input/output cell, the first register having an input adaptable to be coupled to the first input/output pad and an output coupled to a dedicated signal path to a pair of adjacent registers of the programmable logic device and adaptable to be coupled to a programmable interconnect matrix of the programmable logic device, the dedicated signal path being separate from the programmable interconnect matrix;

transmitting the first bit from the first register to a second register of one of the pair of adjacent input/output cells via the dedicated signal path and registering the first bit in the second register; and receiving a second bit of the serial data stream at the first input/output pad and registering the second bit in the first register.

10. The method of claim 9 further comprising the step of:

transmitting the first bit from the second register to the programmable interconnect matrix.

11. The method of claim 9 further comprising the step of:

transmitting the second bit from the first register to the programmable interconnect matrix.

12. The method of claim 9 further comprising the steps of:

transmitting the first bit from the second register to the programmable interconnect matrix; and transmitting the second bit from the first register to the second register and registering the second bit in the second register.

13. A method of registering data in a programmable logic device comprising the steps of:

receiving a first bit of a serial data stream from a programmable interconnect matrix of the programmable logic device at an input of a first register of a first input/output cell of the programmable logic device, the first register having an output adaptable to be coupled to a first input/output pad and an input adaptable to be coupled to the programmable interconnect matrix and to a dedicated signal path from a pair of adjacent input/output cells of the programmable logic device, the dedicated signal path being separate from the programmable interconnect matrix and registering the first bit in the first register;

transmitting the first bit from the first register to a second register of one of the pair of adjacent input/output cells and registering the first bit in the second register; and receiving a second bit of the serial data stream from the programmable interconnect matrix at the input of the first register and registering the second bit in the first register.

14. The method of claim 13 further comprising the step of:

transmitting the first bit from the second register to the second input/output pad.

15. The method of claim 13 further comprising the step of:

transmitting the second bit from the first register to the first input/output pad.

16. The method of claim 13 further comprising the steps of:

transmitting the first bit from the second register to the second input/output pad; and transmitting the second bit from the first register to the second register and registering the second bit in the second register.

17. The method of claim 13 wherein the output of the second register is further adaptable to be coupled to the programmable interconnect matrix, the first register and the second resister adaptable to be under the control of a first signal from the programmable interconnect matrix, the method further comprising the steps of:

transmitting the first bit from the second register to the programmable interconnect matrix;

transmitting the second bit from the first register to the second register and registering the second bit in the second register in response to the first signal from the programmable interconnect matrix; and transmitting the first bit from the programmable interconnect matrix to the first register and registering the first bit in the first register in response to the first signal from the programmable interconnect matrix.

18. The method of claim 17 further comprising the steps of:

transmitting the second bit from the second register to the programmable interconnect matrix; and transmitting the first bit from the first register to the second register and registering the first bit in the second register.

19. A programmable input/output cell for a programmable logic device having a programmable interconnect matrix, the programmable input/output cell comprising:

an input/output pad;

a first register having an input adaptable to be coupled to the input/output pad and further having an output coupled to a first dedicated signal path separate from the programmable interconnect matrix to a pair of adjacent input/output cells;

a second register having an input adaptable to be coupled to the programmable interconnect matrix and further having an output coupled to a second dedicated signal path separate from the programmable interconnect matrix to the pair of adjacent input/output cells;

a first buffer having an input coupled to the output of the first register and an output adaptable to be coupled to the programmable interconnect matrix, the first buffer adaptable to be under the control of a first signal from the programmable interconnect matrix; and a second buffer having an input adaptable to be coupled to the output of the second register and an output coupled to the input/output pad, the second buffer adaptable to be under the control of a second signal from the programmable interconnect matrix.

20. A programmable input/output cell as in claim 19 wherein the output of the first register is further adaptable to be coupled to the input of the second register.

21. A programmable input/output cell as in claim 20 wherein the input of the first register is further adaptable to be coupled to the programmable interconnect matrix.

22. A programmable input/output cell as in claim 21 wherein the input/output pad is further adaptable to be coupled to the programmable interconnect matrix.

23. A programmable input/output cell as in claim 22 wherein the output of the second register is further adaptable to be coupled to an input of a first register of a first adjacent input/output cell.

24. A programmable input/output cell as in claim 23 wherein the output of the first register is further adaptable to be coupled to an input of a second register of the first adjacent input/output cell.

25. A programmable logic device comprising:

a programmable interconnect matrix;

a first input/output cell with a first register having an input and an output, the output of the first register adaptable to be coupled to a first input/output pad and a first dedicated signal path to a pair of adjacent input/output cells separate from the programmable interconnect matrix, the input of the first register adaptable to be coupled to the programmable interconnect matrix; and a second input/output cell with a second register having an input and an output, the output of the second register adaptable to be coupled to a second input/output pad, the input of the second register adaptable to be coupled to the first dedicated signal path, the programmable interconnect matrix and the second input/output pad via the programmable interconnect matrix;

wherein the output of the first register is further adaptable to be coupled to the input of the second register.

26. A programmable logic device as in claim 25 wherein the input of the first register is further adaptable to be coupled to the first input/output pad via the programmable interconnect matrix.

27. A programmable logic device as in claim 26 wherein the output of the first register is further adaptable to be coupled to the programmable interconnect matrix.

28. A programmable logic device as in claim 27 wherein the output of the second register is further adaptable to be coupled to the programmable interconnect matrix.

29. A programmable input/output cell for a programmable logic device having a programmable interconnect matrix, the programmable input/output cell comprising:

an input/output pad;

a register having output adaptable to be coupled to the input/output pad and the programmable interconnect matrix, and further coupled to a dedicated signal path to a pair of adjacent input/output cells separate from the programmable interconnect matrix having an input;

a first buffer having an input adaptable to be coupled to the programmable interconnect matrix, and further having an output coupled to the input/output pad, the first buffer adaptable to be under the control of a first signal from the programmable interconnect matrix; and a second buffer having an input coupled to the input/output pad, the second buffer adaptable to be under the control of a second signal from the programmable interconnect matrix.

30. A programmable input/output cell as in claim 29 wherein the input of the register is further adaptable to be coupled to the input/output pin.

31. A programmable input/output cell as in claim 30 wherein the input of the register is further adaptable to be coupled to a register output of a first adjacent input/output cell.

32. A programmable input/output cell as in claim 31 wherein the output of the register is further adaptable to be coupled to a register input of the first input/output adjacent cell.

33. A programmable input/output cell as in claim 32 wherein the output of the register is further adaptable to be coupled to a register input of a second adjacent input/output cell.

34. A programmable input/output cell as in claim 33 wherein the input of the register is further adaptable to be coupled to a register output of the second adjacent input/output cell.

* * * * *